United States Patent [19]
Barrett, Jr. et al.

[11] Patent Number: 5,825,213
[45] Date of Patent: Oct. 20, 1998

[54] METHOD AND APPARATUS FOR FREQUENCY SYNTHESIS

[75] Inventors: Raymond Louis Barrett, Jr., Ft. Lauderdale; Barry Herold, Boca Raton; Grazyna A. Pajunen, Delray Beach, all of Fla.

[73] Assignee: Motorola, Inc., Schaumburg, Ill.

[21] Appl. No.: 766,953

[22] Filed: Dec. 16, 1996

[51] Int. Cl.$^6$ .................................................. H03L 7/18
[52] U.S. Cl. ........................................ 327/105; 327/107
[58] Field of Search ................................ 327/105–107, 327/113, 114, 115, 117; 377/48, 49; 331/1 A

[56] References Cited

U.S. PATENT DOCUMENTS

| | | | |
|---|---|---|---|
| 3,872,397 | 3/1975 | Hanneman | 331/1 A |
| 4,573,176 | 2/1986 | Yeager | 377/48 |
| 4,918,403 | 4/1990 | Martin | 331/1 A |
| 5,055,802 | 10/1991 | Hieatala et al. | 331/16 |
| 5,065,408 | 11/1991 | Gillig | 375/8 |
| 5,606,736 | 2/1997 | Hasler et al. | 455/314 |

OTHER PUBLICATIONS

"Frequency Synthesizer Design Handbook" by James A. Crawford, Norwood, MA, copyrighted 1994, especially chapter 9.

*Primary Examiner*—Tuan T. Lam
*Attorney, Agent, or Firm*—Pedro P. Hernandez

[57] ABSTRACT

A method and apparatus for frequency synthesis replaces a conventional divide-by-N counter with a low-power binary ripple counter (108). The method and apparatus employs a difference comparison scheme (114) that provides arbitrarily precise channel spacing, and allows loop sample rate to be selected independent of channel spacing.

17 Claims, 4 Drawing Sheets

METHOD AND APPARATUS FOR FREQUENCY SYNTHESIS

FIELD OF THE INVENTION

This invention relates to frequency synthesis, and more particularly to a method and apparatus for frequency synthesis having relatively low power requirements and permitting arbitrarily precise frequency synthesis increment that is separately selectable from the loop sampling rate.

BACKGROUND OF THE INVENTION

The Phase Locked Loop (PLL) is widely used for frequency synthesis. Conventional PLLs typically force a designer to trade off the band width needed for fast acquisition and wide band noise reduction for channel spacing. That is, in a conventional PLL the loop's output frequency is divided down to approximately the desired channel spacing, and a phase comparison is made at that frequency with a reference frequency. Consequently, the loop filter's frequency response needs to be on the order of the Nyquist rate for the channel spacing frequency. This is theoretically no more than 50% of the channel spacing frequency, which is quite low for narrow channel spacing. Moreover, for optimal lock time, loop filters need to be on the order of 7% of the channel spacing frequency, which is extremely narrow.

"Fractional-N" techniques have been used to allow faster loop response times for relatively narrow channel spacing (see, for example, *Frequency Synthesizer Design Handbook*, James A. Crawford, Artech House, Inc., Norwood, Mass., 1994, pages 387–419). Fractional-N synthesis dynamically alters the divisor of the frequency divider in the PLL. However, fractional-N synthesis results in undesired spurious side band noise, and relatively high power consumption due to the complexity of the loop divider.

Consequently, what is needed is a frequency synthesis method and apparatus that requires relatively low power, relatively low noise, and does not require a trade off between loop response time and channel spacing.

DETAILED DESCRIPTION OF THE DRAWINGS

Figure 1:
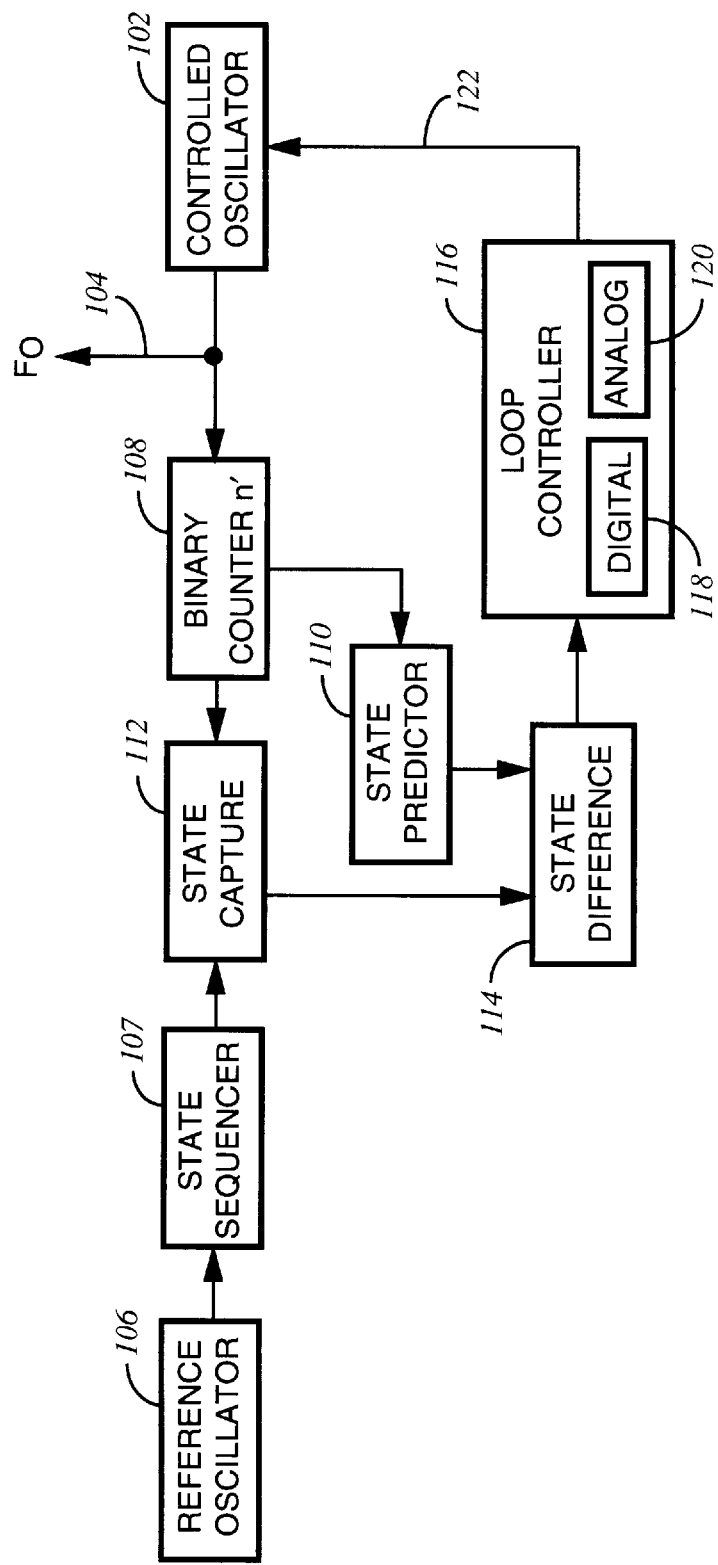
FIG. 1 is a schematic diagram of a Phase Lock Loop architecture.

Generally, the preferred method and apparatus embodying the present invention comprises a novel PLL architecture, and its method of operation. As will be recognized by those skilled in the field of PLLs, in conventional PLLs the output frequency of the loop (represented by $F_O$) is divided down and compared with an accurate reference frequency (represented by $F_R$). The phases of the two frequencies are compared, and $F_O$ is adjusted proportionately to the phase difference, in order to eliminate the phase difference. Such a scheme requires that $F_O$ be divided all the way down to $F_R$. In conventional, non-fractional-N PLLs, $F_R$ must be equal to the desired channel spacing. (For a detailed understanding of the relevant PLL concepts, see *Frequency Synthesizer Design Handbook*, James A. Crawford, Artech House, Inc., Norwood, Mass., 1994, which is incorporated in its entirety by this reference.) Consequently, if $F_O$ is relatively high, then $F_O$ must be divided very drastically by the digital loop divider. It will be recognized that such a loop divider requires a relatively large number of flip-flops and related circuitry, the flip-flops switching rapidly and often. Therefore, such a loop divider requires relatively high power. Additionally, it will be recognized that for this sort of conventional PLL. the loop response time, and therefore the "lock" time, is relatively slow because the loop filter's band width must be narrow, on the order of the channel spacing $F_R$.

An alternative approach has been fractional-N synthesis, wherein the divisor of the loop divider is modulated between "divisor" and "divisor+1". The improvement brought by this scheme is that the channel spacing is now defined by $(F_O/\text{divisor})-(F_O/(\text{divisor}+1))$. $F_R$ may now be much higher than the desired channel spacing, so the loop response can be faster. The disadvantage of this approach is that the modulation of the loop divider creates a great deal of undesirable spurious noise. Additionally, $F_O$ must still be divided down to $F_R$, and the phase differences compared.

As applied to PLL architecture, the present invention departs rather dramatically from the two conventional schemes described above. A PLL in accordance with the present invention does not require that $F_O$ be divided all the way down to $F_R$, nor does it require modulation of the loop divider divisor. Moreover, the preferred PLL in accordance with the present invention does not directly compare phases of a divided $F_O$ with $F_R$. Rather, the preferred PLL in accordance with the present invention uses a calculated prediction to determine a difference between the actual $F_O$ and the desired output frequency, represented by $F_{Od}$. As will be recognized from the more detailed discussion to follow, the result is that the preferred PLL in accordance with the present invention uses a relatively simple and low power ripple counter for its loop divider, allows independent selection of loop sample frequency and channel spacing such that the loop response may be much higher than conventional non-fractional-N PLLs while the channel spacing can be arbitrarily small.

Figure 2:
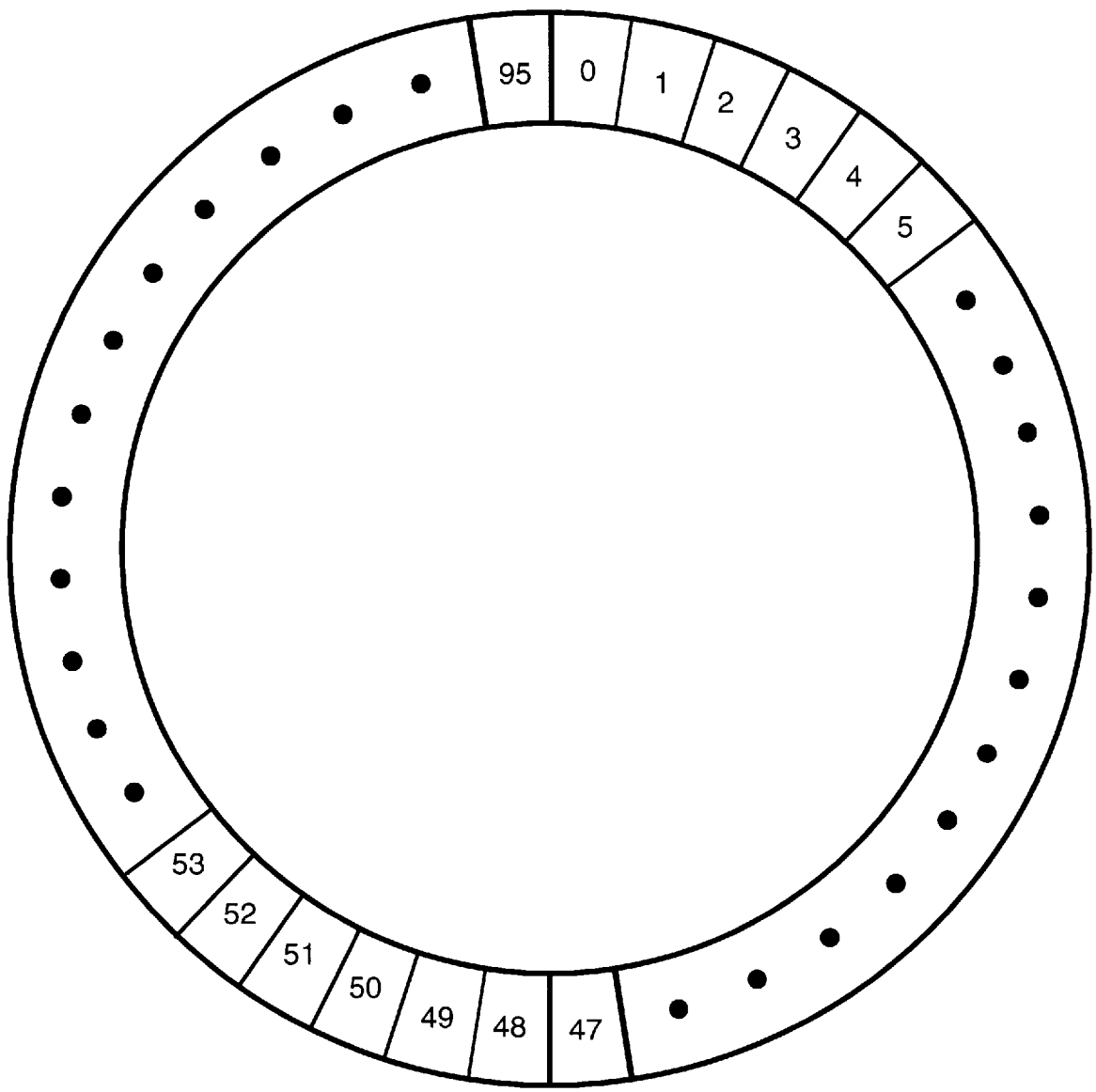
FIG. 2 is a schematic representation of the state sequence progression of the state sequencer element in FIG. 1.

Turning to the figures for more detailed understanding of the present invention, FIG. 1 is a schematic diagram of the preferred PLL 100 which takes advantage of the present invention. PLL 100 includes a controlled oscillator 102 generating an output frequency $F_O$ 104. Additionally, PLL 100 includes a reference oscillator 106, which is coupled to a "state sequencer" 107. The output of reference oscillator 106 is referred to as the state progression frequency and is used to sequence the state sequencer 107 through a predetermined number of states. For the purposes of the present explanation, the predetermined number of states is represented by k. In the present illustrative example, the state sequencer has ninety-six different states, that is, k=96. Turning briefly to FIG. 2, the ninety-six states are illustrated by a repetitive state sequence 200. For the purposes of comparing the novel PLL disclosed here to conventional PLLS, one cycle of the state sequence 200 will be viewed as one cycle of the reference frequency, $F_R$. Consequently, the state sequencer traverses sequence 200 at frequency $F_R$.

Moving forward with the explanation of the concepts underlying the present invention, it will be recognized that for any desired output frequency, represented by $F_{Od}$, and for a particular $F_R$ used in a frequency synthesizer, an "n" may be selected such that $F_{Od}/n=F_R$. For a conventional non-fractional-N PLL, n would be the loop divider divisor. However, as has been discussed above, it is desirable to divide $F_O$ by much less than n. Consistent with this preference, PLL 100 includes a binary counter 108 (also referred to as a frequency divider). The counter 108 in merely a simple ripple counter (the typical characteristics of which are well known in the art) and, importantly, the counter 108 divides $F_O$ by a counter number (also called a divider integer) n', which is preferably much less than n. (In the preferred embodiment, n' is the value of the most significant bit of the binary representation of n.) This means that the frequency of the output of counter 108, referred to as a sample frequency FS (and also referred to as a loop divider output signal), is n/n' times $F_R$ whenever $F_O$ is at the desired $F_{Od}$. Therefore, the period of FS (that is, 1/FS) equals (n'/n)·1/$F_R$ (1/$F_R$ being the period of $F_R$). It will be recognized, therefore, that each time the binary counter 108 completes its count of n' (this occurs every 1/FS seconds) the state sequencer 107 will have traversed n'/n times k states since the state sequencer 107 traverses k states in a full period of 1/$F_R$ seconds.

Figure 4:
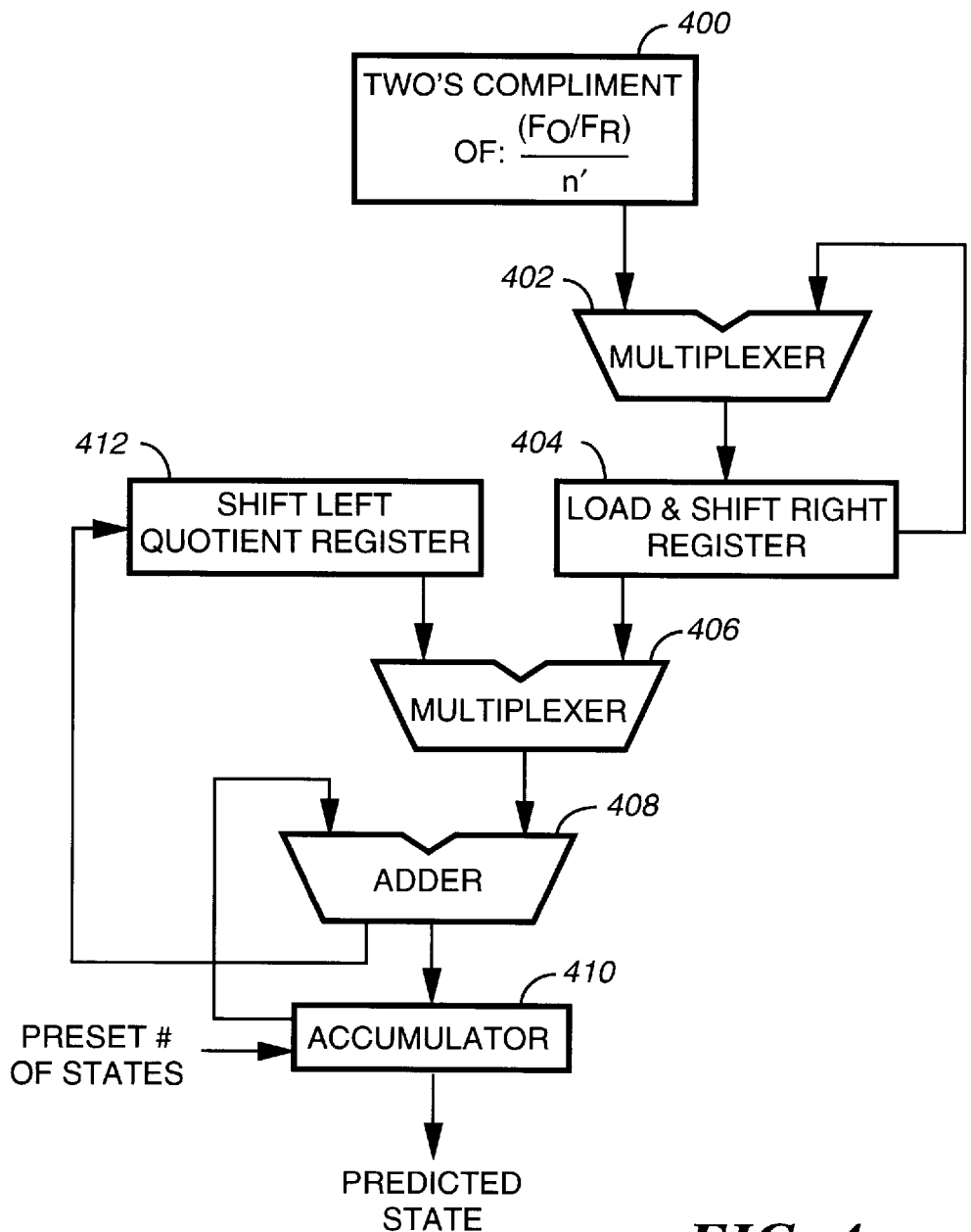
FIG. 4 is a schematic diagram of logic used to calculate a predicted (expected) state.

Since, given the forgoing explanation, it is known in advance the exact number (and fraction) of states that are completed, it is possible to construct a state predictor 110 which accumulates k·(n'/n) states for each event of the binary counter 108 completion. That is, referring briefly to FIG. 2, an accumulator's value moves around the circle 200, adding k·(n'/n) states to the previous value so long as $F_{Od}$ remains the same, and then resets to an initial k·(n'/n) when $F_{Od}$ changes, and subsequently begins accumulating again. (The details of the preferred state predictor 110 are provided below with reference to FIG. 4.)

Accordingly, the novel PLL works in the following fashion. At the occurrence of each completion of the binary counter's n' count, the current state of the state sequencer 107 is captured by a state capture element 112. This captured state may also be referred to as a captured state value. Additionally, for each completion of the binary counter's n' count, the state predictor 110 provides an expected state value (also referred to as a predicted state). The captured state and the expected state are fed to a state difference detector 114. The state difference detector 114 measures the difference between the predicted state and the current state, and feeds this difference to a loop controller 116, which uses that difference to adjust controlled oscillator 102 to reduce the difference, i.e. to bring $F_O$ closer to $F_{Od}$. The loop controller may use one of many well known control algorithms to accomplish this. For the embodiment shown, the discrete-time classical control algorithm is preferred.

Recall now that the predicted state is based on an accumulated value of k·(n'/n), which may be a real number, having an integer and a fractional part. However, because the state sequencer 107 is a digital, the captured state will always be an integer value. Nevertheless, the inventive PLL system presented here incorporates a novel scheme enabling the difference detector 114 to establish a fractional value for the current state, that is, to determine the fraction of the duration of the current state into which the completion of the n' count occurred. This is explained with reference to FIG. 3.

Figure 3:
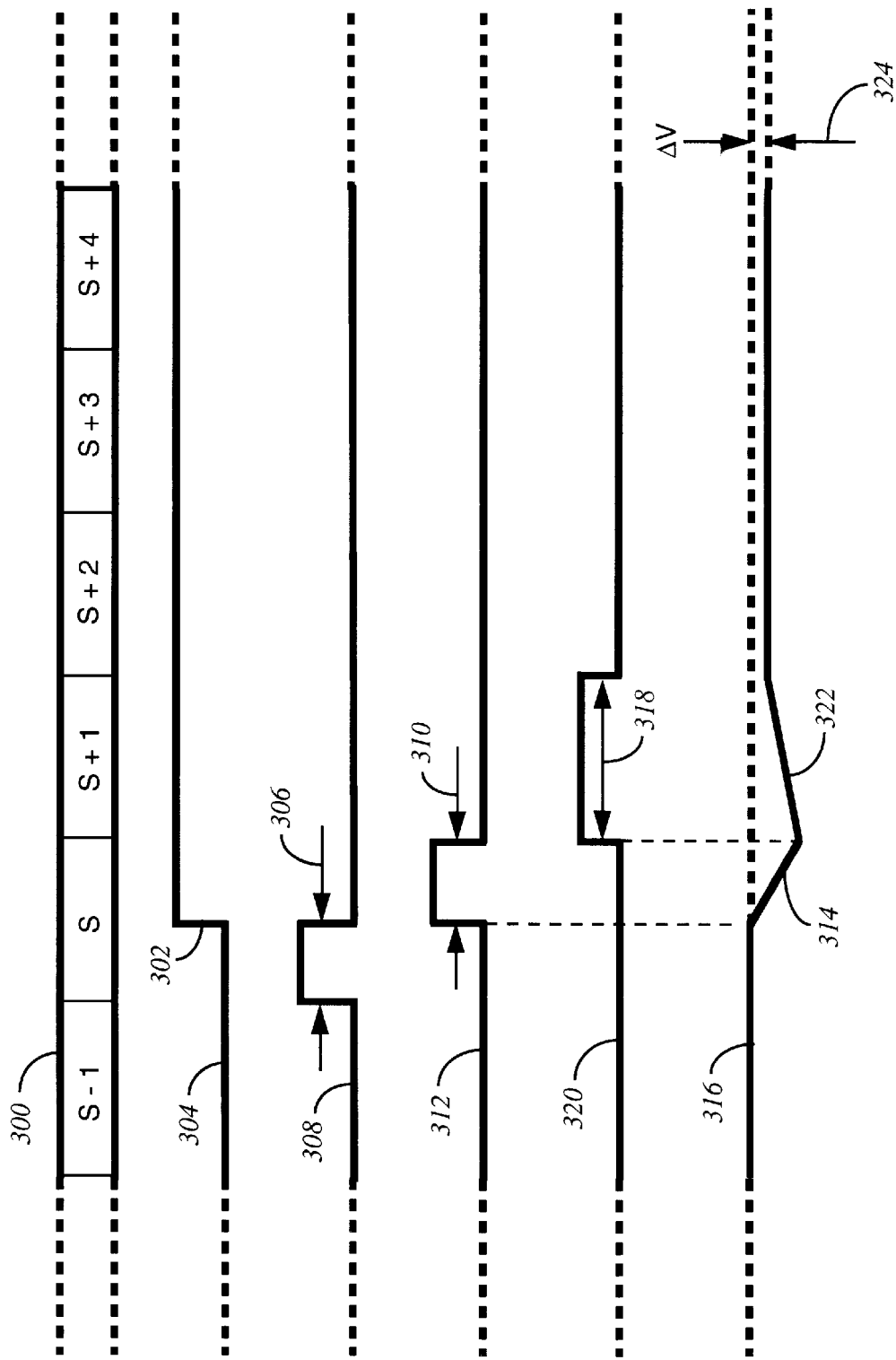
FIG. 3 is a graphical representation of parameters used for measuring the difference between a current state of the state sequencer element of FIG. 1, and an expected state.

FIG. 3 shows a state sequence 300, which represents the consecutive states of the state sequencer 107. Rise 302 of trace 304 represents the occurrence of the completion of n' counts from the binary counter 108. Consequently, region 306 of trace 308 represents the fraction of state S, the current/captured state, into which the completion of the n' count occurred. And therefore, region 310 of trace 312 represents the remainder of state S. According to the preferred embodiment, a capacitor is allowed to discharge with a reference current, Iref, for the duration of region 310.

The resulting change in voltage on the capacitor is shown as voltage change 314 of trace 316.

Now, we have said that the state predictor has determined a predicted fractional portion into the predicted state where rise 302 should have occurred. For ease of explanation, we will use an example value of 0.5, or halfway into the state. The difference detector uses this value, in our example, 0.5, to modulate the reference current Iref, and recharge the capacitor at this current level (i.e. 0.5·Iref) for a entire state period. This is illustrated as region 318 of trace 320, and the resultant change in voltage on the capacitor is shown as voltage change 322 of trace 316. The result is that ΔV 324 reflects the difference in the actual fractional portion of a state into which rise 302 occurred, and the predicted fraction portion. Returning now to FIG. 1, this value of ΔV, together with any integer portion of the difference between that captured state and the predicted state, is fed to loop controller 116, each either in digital or analog form, as the application requires. In the embodiment shown here, it is most efficient to deliver at the fractional difference value, ΔV 324, in analog form, to avoid an extra analog to digital conversion, and to deliver the integer portion of the state difference in digital form to avoid an extra digital to analog conversion.

Accordingly, the loop controller 116 preferable has a digital portion 118 which deals with the integer portion of the state difference (which is a digital value), and an analog portion 120 which deals with the fractional difference value (which is an analog value). The digital portion 118 preferably executes a fast discrete time version of the discrete-time classical control algorithm, while the analog portion 120 preferably executes the same discrete-time classical control algorithm, on different computational hardware. The digital portion output signal is then linearly combined with the analog portion output signal by simple addition of the outputs. The combined signal is fed to the controlled oscillator 102 as the output frequency control signal. (In alternative embodiments the output frequency control signal may be provided in digital form if the application requires such.) The described scheme allows the digital hardware to control the system until the errors are small, and then the analog hardware deals with the small corrections needed near the correct operating point. This avoids quantified error and its attendant noise when the PLL is near the correct operating point.

As mentioned above, the preferred embodiment of the present invention incorporates a particularly advantageous means for producing the predicted state in state predictor 110. State predictor 110 includes the hardware shown in FIG. 4. As discussed above, the predicted state is the accumulating value of k·(n'/n). First it is recognized that k·(n'/n)=k/(($F_{Od}/F_R$)/n'). Accordingly, the logic shown in FIG. 4 accomplishes the task of dividing k by (($F_{Od}/F_R$)/n'), and then accumulating values of k/(($F_{Od}/F_R$)/n'), modulo k so long as $F_{Od}$ remains the same. (The division is accomplished using a convention two's compliment technique described in more detail below.) When $F_{Od}$ changes (e.g. a frequency hop), a new initial k/(($F_{Od}/F_R$)/n') is calculated, and then accumulation modulo k begins again.

More specifically, when a new $F_{Od}$ is selected, a two's compliment representation of (($F_{Od}/F_R$)/n') (box 400) is passed through multiplexer 402 to load and shift right register 404. The value is then passed through multiplexer 406 to adder 408. On this first pass accumulator 410 has been loaded with the value k. Therefore, on this first pass adder 408 adds k to the two's compliment representation of $((F_{Od}/F_R)/n')$. If the result is positive then a one (1) is shifted into shift left quotient register 412 and the result from the addition is stored in the accumulator register 410. If the result is negative, then a zero (0) is shifted into register 412, and k remains n the accumulator 410. Subsequently, the value in the accumulator 410 is added to the shifted right value flowing down from register 404. Again, if the result is positive then a one (1) is shifted into shift left quotient register 412 and the result from the addition is stored in the accumulator register 410. If the result is negative, then a zero (0) is shifted into register 412, and the accumulator 410 remains unchanged. This process occurs recursively for a number of iterations equal to the number of bits used to represent the values k and $((F_{Od}/F_R/n'))$. It will be recognized by those familiar with two's compliment techniques for digital division that the value $k/((F_{Od}/F_R/n')$ ultimately results in the quotient register 412. This is the initial predicted state for a new $F_{Od}$.

It is worth noting at this point that the precision of the prediction is limited only by the number of bits dedicated to the calculation. Combining this notion with the analog fraction-portion difference detection technique described above, we see that any desired frequency accuracy and frequency spacing (i.e. channel spacing) may be achieved. For example, with twenty (20) bit calculations, 1 part per million (e.g. 1 KHz channel spacing at 1 GHz) may be achieved irrespective of the sample frequency FS, which conventionally dictates the channel spacing. Therefore, FS may be much higher than the channel spacing, allowing faster loop response. Preferably FS is at least two times the channel spacing.

Returning to the figure to complete the explanation, once an initial predicted value is in the quotient register 412, it is added to itself, modulo k, the result being stored in the accumulator. This process may be viewed graphically as moving around state sequence 200 (FIG. 2) in jumps of $k/((F_{Od}/F_R/n')$. Each subsequent result is the subsequent expected (predicted) state corresponding to the subsequent n' count of the binary counter 108. This continues so long as $F_{Od}$ remains unchanged. One other way to view this part of the process is that the initial predicted or expected state is being multiplied by consecutive integers to provide the subsequent expected states. When $F_{Od}$ is changed (i.e. a frequency hop is desired), the process described above starts from the beginning, loading a new two's compliment value into load and shift right register 404, and loading k in accumulator 410.

Consequently, A PLL in accordance with the present invention has been disclosed that does not require that $F_O$ be divided all the way down to $F_R$, nor does it require modulation of as loop divider divisor. This results in a PLL architecture that uses a relatively simple and low power ripple counter for its loop divider, and allows independent selection of loop sample frequency and channel spacing such that the loop response may be much higher than conventional non-fractional-N PLLs while the channel spacing can be arbitrarily small.

We claim:

1. A method for frequency synthesis comprising the steps of:

sequencing through a sequence of states at a reference frequency;

dividing an output frequency by a counter number to provide a loop divider output signal;

upon occurrence of the loop divider output signal, capturing a current state being one of the sequence of states and providing an expected state;

comparing the current state to the expected state, thereby providing a state difference; and adjusting the output frequency to a desired output frequency according to the state difference.

2. The method of claim 1, wherein k represents a total number of states in the sequence of states, and the step of providing the expected state further;

providing a subsequent expected state which is equal to an integer multiplied by the expected state, modulo k.

3. The method of claim 1, wherein the current state and the expected state each have an integer portion and a fractional portion, and wherein the step of adjusting comprises providing a first adjustment signal indicative of a difference between the integer portion of the current state and the integer portion of the expected state, and providing a second adjustment signal indicative of a difference between the fractional portion of the expected state and the fractional portion of the current state when the loop divider output signal occurs.

4. The method of claim 1, wherein k represents a total number of states in the sequence of states, n' represents the counter number, $F_{Od}$ represents the desired output frequency, $F_R$ represents the reference frequency at which the sequence of states is entirely traverse, and the expected state is represented by $k/((F_{Od}/F_R)/n')$.

5. The method of claim 4, wherein n' equals a value of a most significant bit of a binary representation of $F_{Od}/F_R$.

6. A method for frequency synthesis comprising the steps of:

dividing an output frequency by a divider integer, thereby providing a sample frequency;

sequencing through a number of states at a reference frequency;

periodically, and at the sample frequency, capturing a captured particular one of the number of states;

calculating a predicted particular one of the number of states;

comparing the captured particular one of the number of states to the predicted particular one of the number of states to provide a state difference; and adjusting the output frequency to a desired output frequency according to the state difference.

7. The method of claim 6, wherein the reference frequency at which the number of states is traversed is represented by $F_R$, the divider integer is represented by n', the number of states is represented by k, and the desired output frequency is represented by $F_{Od}$, and wherein the step of calculating comprises the step of dividing k by a quantity $((F_{Od}/F_R)/n')$.

8. The method of claim 7, wherein the step of dividing comprises digitally dividing a digital representation of k by a digital representation of the quantity $((F_{Od}/F_R)/n')$ utilizing a two's complement conversion of the digital representation of the quantity $((F_{Od}/F_R)/n')$.

9. An apparatus for frequency synthesis comprising:

a controlled oscillator providing an output frequency;

a frequency divider coupled to the controlled oscillator, the frequency divider dividing the output frequency to provide a sample frequency;

a reference oscillator providing a state progression frequency;

a state sequencer receiving the state progression frequency, the state progression frequency causing the state sequencer to sequence through a plurality of states, and the state sequencer sequentially providing a plurality of captured state values at the sample frequency;

a state predictor providing a plurality of predicted state values at the sample frequency each corresponding to a respective one of the plurality of captured state values;

a state difference detector receiving the captured state values and corresponding predicted state values, and in response providing a state difference signal; and a loop controller coupled to the state difference detector, receiving the state difference signal and in response providing an output frequency control signal to the controlled oscillator.

10. The apparatus of claim 9, wherein the state difference signal comprises a digital value.

11. The apparatus of claim 9, wherein the state difference signal comprises an analog signal.

12. The apparatus of claim 9, wherein the output frequency control signal comprises a digital value.

13. The apparatus of claim 9, wherein the output frequency control signal comprises an analog signal.

14. The apparatus of claim 9, wherein the loop controller comprises a digital portion and an analog portion, the digital portion generating a digital portion of the output frequency control signal proportional to an integer portion of the state difference signal, and the analog portion generating an analog portion of the output frequency control signal proportional to a fractional portion of the state difference signal.

15. The apparatus of claim 14, wherein the output frequency control signal comprises a sum of the digital portion of the output frequency control signal and the analog portion of the output the frequency control signal.

16. An apparatus for frequency synthesis comprising:

a frequency divider dividing an output frequency to provide a sample frequency;

a state sequencer receiving a state progression frequency, the state progression frequency causing the state sequencer to sequence through a plurality of states, and the state sequencer sequentially providing a plurality of captured state values at the sample frequency;

a state predictor providing a plurality of predicted state values at the sample frequency each corresponding to a respective one of the plurality of captured state values; and a state difference detector receiving the captured state values and the corresponding predicted state values, and in response providing a state difference signal.

17. The apparatus of claim 16, further comprising a loop controller coupled to the state difference detector, the loop controller receiving the state difference signal and in response providing an output frequency control signal controlling the frequency of the output frequency.

* * * * *